(12) United States Patent
Sawada et al.

(10) Patent No.: US 6,683,376 B2
(45) Date of Patent: Jan. 27, 2004

(54) DIRECT BONDING OF SMALL PARTS AND MODULE OF COMBINED SMALL PARTS WITHOUT AN INTERMEDIATE LAYER INBETWEEN

(75) Inventors: Kiyoshi Sawada, Sunto-gun (JP); Tomohiko Kawai, Minamitsumi-gun (JP)

(73) Assignee: Fanuc Ltd., Yamanashi (JP)

(*) Notice: Subject to any disclaimer, the term of this patent is extended or adjusted under 35 U.S.C. 154(b) by 15 days.

(21) Appl. No.: 09/297,288

(22) PCT Filed: Sep. 1, 1998

(86) PCT No.: PCT/JP98/03894
§ 371 (c)(1),
(2), (4) Date: Apr. 29, 1999

(87) PCT Pub. No.: WO99/12207
PCT Pub. Date: Mar. 11, 1999

(65) Prior Publication Data
US 2002/0030285 A1 Mar. 14, 2002

(30) Foreign Application Priority Data
Sep. 1, 1997 (JP) .............................................. 9-252709

(51) Int. Cl.$^7$ ............................................. B28B 204/39
(52) U.S. Cl. ..................... 257/692; 257/618; 257/723; 257/729; 257/730; 257/774
(58) Field of Search ................................ 257/692, 723, 257/729, 730, 774, 618

(56) References Cited

U.S. PATENT DOCUMENTS

| 3,880,674 A | * | 4/1975 | Saunders ..................... 136/237 |
| 5,078,551 A | | 1/1992 | Oomen |
| 6,068,801 A | * | 5/2000 | Bodo et al. ................... 264/39 |

FOREIGN PATENT DOCUMENTS

| JP | 52-123171 | 10/1977 |
| JP | 58-95862 | 6/1983 |
| JP | 03-131407 | 6/1991 |
| JP | 4-181765 | 6/1992 |
| JP | 5-259378 | 10/1993 |

* cited by examiner

*Primary Examiner*—Fetsum Abraham
(74) *Attorney, Agent, or Firm*—Staas & Halsey LLP

(57) ABSTRACT

A groove having a V-shaped section is provided on a bonding surface of an IC chip being as a first small part, while an elongate projection having a V-shaped section to engage with the groove of the first IC chip is provided on a corresponding portion of a bonding surface of an IC chip being as a second small part. Then, the IC chips are bonded together by the action of a holding force resulting from fitting the elongate protection of the second IC chip to the groove of the first IC chip, together with a bonding force produced between the bonding surfaces by interatomic force and metallic bond.

5 Claims, 5 Drawing Sheets

DIRECT BONDING OF SMALL PARTS AND MODULE OF COMBINED SMALL PARTS WITHOUT AN INTERMEDIATE LAYER INBETWEEN

BACKGROUND OF THE INVENTION

1. Field of the Invention

This invention relates to a bonding method of small parts such as LSI or like semiconductor parts, semiconductor devices and IC chips serving as elemental parts of a micromachine, and a module of combined small parts formed by bonding these small parts together.

2. Description of the Related Art

A machine of mm order such as a micromachine composed of a plurality of small parts has been developed. The small parts include IC chips or the like, for instance, and the machine such as the micromachine is assembled by bonding the IC chips together.

The problems arising when bonding the IC chips together are positioning accuracy of small parts to be bonded together, dimensional dispersion caused by the film thickness of an adhesive applied between the small parts and the deficiency in bonding strength resulting from insufficient bonding area.

As a method for obtaining a sufficient bonding strength in bonding small parts together, a hydrogen-bond applied technique is known, in which silicon wafers, each having a bonding surface subjected to surface hydrophilic treatment (absorption of OH group) is treated with heat of a temperature of not less than 1000° C. under no pressure to form a surface oxidized layer, and the silicon wafers are bonded together through the surface oxidized layers. However, since the bonding has to be made under the extreme environment, it is difficult to use an equipment for positioning of the parts, thereby causing problems such that necessary positioning accuracy cannot be assured and that a large-scaled apparatus is needed for heat treatment.

When electrical connections among the small parts such as IC chips are required, an input/output contact of an IC chip molded with epoxy resin is led outside through a lead frame, a leg of the lead frame is mounted on a substrate and this IC chip is connected with another IC chip mounted on the substrate in the same manner through printed wiring on the substrate. Recently, a multi-chip module or the like is known, in which a plurality of chips arranged on an alumina substrate are connected together through thin-film copper wiring of about 20 microns in conductor spacing. However, in either case, the connection between the chips requires the wiring, and this wiring has been a major hindrance to higher speed and higher integration of a circuit.

According to the recent technique, the width or conductor spacing of sub-micron order is practically available for the wiring produced by a semiconductor process in a chip. However, an interface portion required for the electrical connection between the chips, for instance, connecting portions of the leg of the lead frame and the copper wiring, still requires a considerably large contact area as compared with the width or conductor spacing of the wiring produced by the semiconductor process, further hindering to higher integration of the circuit. To be more specific, the spacing between contacts is about 200 microns with the wiring width of 30 microns in the case where contact connection of wire bonding type is applied, while the spacing between contacts is about 80 microns with the wiring width of 30 microns in the case where contact connection of flip chip bonding type is applied.

SUMMARY OF THE INVENTION

According, it is an object of the present invention to provide a bonding method of small parts and a module of combined small parts formed by bonding the small parts together, wherein slight bonding areas on the small parts suffice to exert a satisfactory bonding strength without need of any adhesive, complicated chemical processing and heat treatments, but the small parts can be bonded together with high positioning accuracy to obtain a circuit of higher speed and higher integration. Additional objects and advantages of the invention will be set forth in part in the description which follows and, in part, will be obvious from the description, or may be learned by practice of the invention.

According to the present invention, a first small part and a second small part are bonded together by means of one or two or more V-shaped grooves formed on a bonding surface of the first small part, and grooves V-shaped elongate projections, which are engageable with the V-shaped grooves, on a bonding surface of the second small part, thereby fitting the V-shaped elongate projections of the second small part to the V-shaped grooves of the first small part.

According to the present invention, the small parts can be bonded together with a sufficient strength without requiring any adhesive, complicated chemical processing and heat treatments, and the degree of the strength of the bonded state of the small parts can be determined selectively at will if occasion demands. Moreover, since the elongate projection and the tapered groove are joined by being fitted with each other, the positioning accuracy in bonding the small parts together can also be assured.

Further, since the tapered groove and the elongate projection serving as bonding portions of the small parts are provided with electrical contacts for transfer of signals between the objects to be bonded together to electrically connect the small parts together, any intermediate connecting mechanisms such as a lead frame, printed wiring and copper wiring becomes unnecessary, thereby making it possible not only to obtain a circuit of higher speed, but also to prevent the inevitable increase in the size of the node at a portion of connection between the contact and the wiring, contributing to higher integration of the circuit too.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED IMBODIMENTS

An embodiment of a bonding method of small parts according to the present invention is described which is applied to bonding of IC chips serving as elemental parts of a micromachine. The micromachine is considered to be a machine composed of elemental parts having size in the range from about 1 μm to 1 mm.

Incidentally, the small parts mentioned in the description of the present invention include parts such as LSI or similar semiconductor parts and semiconductor devices, in addition to IC chips constituting a micromachine. These small parts normally include parts having a size of submillimeters to millimeters, or may also include parts having a size larger than the above.

Figure 1A:
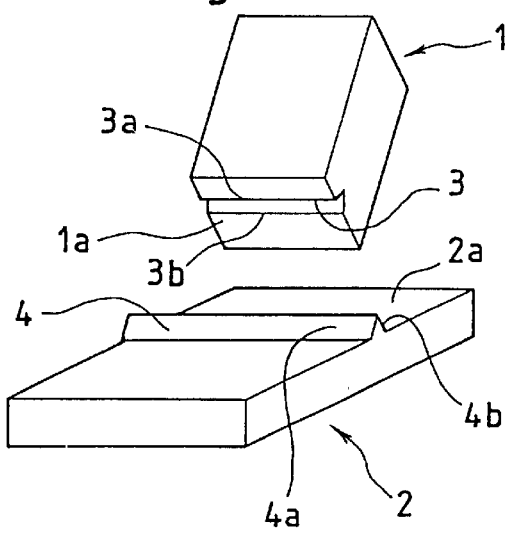
FIG. 1A is a perspective view showing a first IC chip having one V-shaped groove, together with a second IC chip having one V-shaped elongate projection.
Figure 1B:
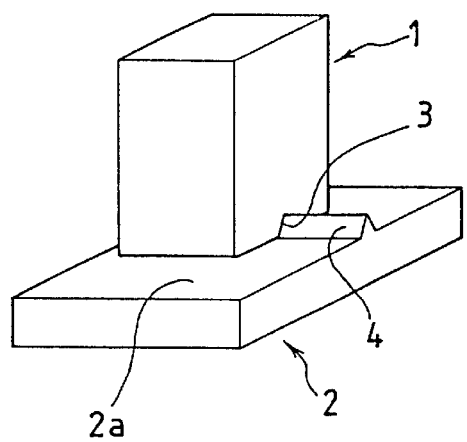
FIG. 1B is a perspective view showing the state in which the first IC chip and the second IC chip bonded together by fitting the V-shaped groove of the first IC chip shown in FIG. 1A to the V-shaped elongate projection of the second IC chip shown in FIG. 1A according to a method of the present invention.

FIGS. 1A and 1B show an embodiment in which two IC chips 1 and 2 of rectangular parallelepiped shape are bonded together by means of fitting an elongate projection into a tapered groove.

As shown in FIG. 1A, a tapered groove 3 having a V-shaped section is provided in the center of a bonding surface 1a of one IC chip 1, while an elongate projection 4 having a V-shaped section is provided as one body in the center of a bonding surface 2a of the other IC chip 2 and has tapered surfaces 4a and 4b to be fitted with two walls 3a and 3b of the tapered groove 3.

In the embodiment shown in FIG. 1A, since the IC chip 2 has a relatively small thickness, the tapered groove 3 is provided on the side of the bonding surface 1a of the IC chip 1, while the elongate projection 4 is provided on the side of the bonding surface 2a of the IC chip 2. However, when the IC chip 2 has a sufficient thickness, the tapered groove 3 may be provided on the side of the bonding surface 2a of the IC chip 2, while the elongate projection 4 may be provided on the side of the bonding surface 1a of the IC chip 1.

The appropriate depth of the tapered groove 3 is about 1 to 10 microns, or may be larger if circumstances require, and therefore, may be selectively determined according to the accuracy and the quality of material of the IC chips 1 and 2 for bonding and bonding strength required or the like. The depth of the tapered groove 3 and the height of the elongate projection 4 are micro-millimeters, and the two walls 3a and 3b of the tapered groove 3, the tapered surfaces 4a and 4b of the elongate projection 4 and the bonding surfaces 1a and 2a have to be finished with higher degree of accuracy or surface roughness (that is, with mirror finishing of Rmax not exceeding 0.1 μm).

Machining such as shaping and milling by the use of a single crystalline diamond tool together with a super-precision machine may be used to mechanically from V-shaped grooves with such high accuracy. According to this method, although depending on the accuracy of a machine, V-shaped grooves at a pitch of about 1 micron are machined accurately enough to attain the surface roughness of about 10 nm in Rmax, so that it is possible to flexibly cope with differences in material of the micro part. Further, if machining with a machine and a tool each carefully selected is carried out, it is possible to obtain any depth or tapered angle of the tapered groove 3, and the elongate projection.

Anisotropic etching by the use of KOH is known as a method of forming the highly-accurate V-shaped grooves according to chemical treatment. This anisotropic etching is used for producing an accurate V-shaped groove of 70.5° on 1-0-0 wafer coated with a rectangular mask, by making use of etching speed lag of 1-1-1 surface which is caused by anisotropy when applying etching treatment with KOH to single crystalline silicon. Therefore, mass production of small parts provided with V-shaped grooves having an accurate taper angle is possible provided that an appropriate mask is available. However, the anisotropic etching described above has a disadvantage in that the V-shaped grooves unconditionally have a fixed angle of 70.5° and that a material of a small part has to be one consisting of single crystalline silicon.

As shown in FIG. 1B, the IC chip 1 and the IC chip 2 are bonded together by inserting the elongate projection 4 of the IC chip 2 into the tapered groove 3 of the IC chip 1 and causing the two walls 3a and 3b of the tapered groove 3 to pinch the tapered surfaces 4a and 4b of the elongate projection 4. Since friction is produced between the two walls 3a and 3b and the tapered surfaces 4a and 4b, the IC chip 1 and the IC chip 2 are bonded together by the action of pinching force. In this case, the bonding of the IC chips is based on a wedge effect, and therefore, a description will now be given on the wedge effect in the following.

When the elongate projection 4 of the IC chip 2 is pressed against the tapered groove 3 of the IC chip 1 with a certain force F, the IC chip 1 and the IC chip 2 are elastically deformed, causing a force N to be produced in a direction perpendicular to the tapered surfaces 4a and 4b of the elongate projection 4 (and the two walls 3a and 3b of the tapered groove 3). As a result, a frictional force K proportional to the force N and the coefficient $\mu$ of the friction is produced between the tapered surfaces 4a and 4b of the elongate projection 4 and the two walls 3a and 3b of the tapered groove 3 bonded to the elongate projection. The effect of this frictional force K on the bonding of the IC chip 1 to the IC chip 2 is called the wedge effect. Incidentally, the wedge effect is not only proportional to the press force F and the coefficient $\mu$ of friction, but also depends on an angle $\alpha$ (See FIGS. 6A to 6C) of the tapered surfaces 4a and 4b of the elongate projection 4 (and that of the two walls 3a and 3b of the tapered groove 3).

Since the tapered surfaces 4a and 4b of the elongate projection 4 are pressed very accurately against the two walls 3a and 3b of the tapered groove 3, a bonding force resulting from an interatomic force and metallic bond is produced between the bonding surfaces, in addition to the bonding force based on the wedge effect mentioned above, thereby providing a greater bonding force, compared with that in case of the bonding using only the wedge effects.

Further, since no adhesive has to be used, there is no chance of the dimensional dispersion caused by an adhesive layer interposed between the IC chip 1 and the IC chip 2. Moreover, since the bonding work is carried out at room temperature, it is possible to use a precise positioning device when bonding the IC chip 1 and the IC chip 2 together. Further, since the tapered groove 3 of the IC chip 1 and the elongate projection 4 of the IC chip 2 are used as guides for the final positioning, the IC chips can be positioned with a high accuracy at least in one direction within a horizontal plane.

Figure 2A:
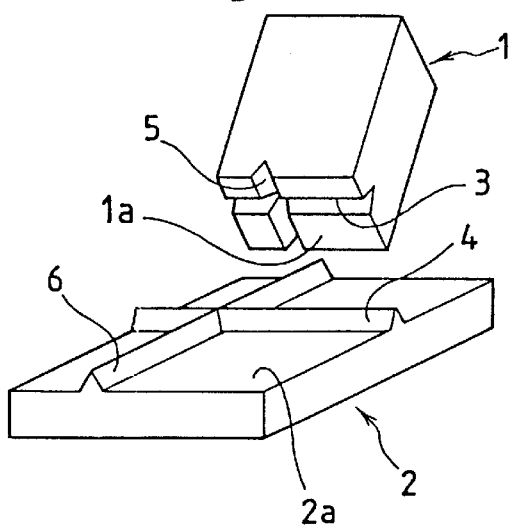
FIG. 2A is a perspective view showing a first IC chip having two V-shaped grooves in different directions, together with a second IC chip having two V-shaped elongate projections in different directions.

When more accurate positioning is required for the bonding of the IC chip 1 to the IC chip 2, two kinds of tapered grooves, such as tapered grooves 3 and 5 different in directivity from each other, are formed on the bonding surface 1a of one IC chip, that is, the IC chip 1, for instance, while elongate projections 4 and 6 respectively corresponding to the tapered grooves 3 and 5 are formed on the bonding surface 2a of the other IC chip, that is, the IC chip 2, as shown in FIG. 2A.

Figure 2B:
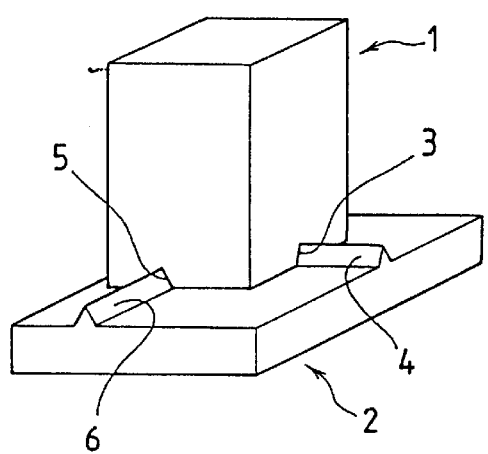
FIG. 2B is a perspective view showing the state in which the first IC chip and the second IC chip are bonded together by fitting the V-shaped grooves of the first IC chip shown in FIG. 2A to the V-shaped elongate projections of the second IC chip shown in FIG. 2A, according to a method of the present invention.

Since the positional relation between the IC chip 1 and the IC chip 2 of FIG. 2A is unconditionally determined according to the tapered grooves 3 and 5 and the elongate projections 4 and 6 respectively located on two straight lines which are not parallel to each other, as shown in FIG. 2B, the positioning work in bonding the both together can be carried out with accuracy to a higher degree. Since the positional accuracy in bonding the IC chip 1 to the IC chip 2 is dependent on the machining accuracy of the tapered grooves 3 and 5 and the elongate projections 4 and 6, the strict accuracy is required for the machining of the tapered grooves 3 and 5 and the elongate projections 4 and 6.

In the embodiment shown in FIG. 2A, the tapered grooves 3 and 5 and their corresponding elongate projections 4 and 6 are provided at right angles with each other. However, it is to be understood that the tapered grooves 3 and 5 and the elongate projections 4 and 6 may be provided at angles other than the right angles. Further, it is not always necessary to provide the tapered grooves 3 and 5 and the elongate projections 4 and 6 intersecting each other at one place overapping with each other, as shown in FIG. 2A Since the bonding force based on the wedge effect is produced between the tapered groove 5 and the elongate projection 6, in addition to the bonding force produced between the tapered groove 3 and the elongate projection 4, it is possible to achieve more firm bonding as compared with the embodiment shown in FIGS. 1A and 1B.

Figure 3A:
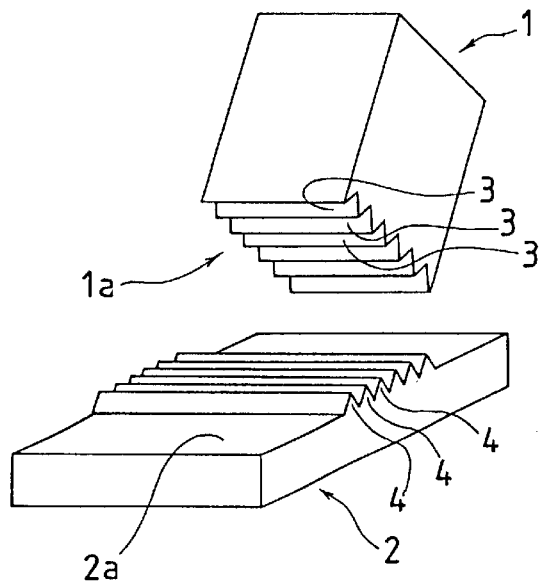
FIG. 3A is a perspective view showing a first IC chip having a large number of V-shaped grooves parallel to one another, together with a second IC chip having a large number of V-shaped elongate projections parallel to one another.
Figure 3B:
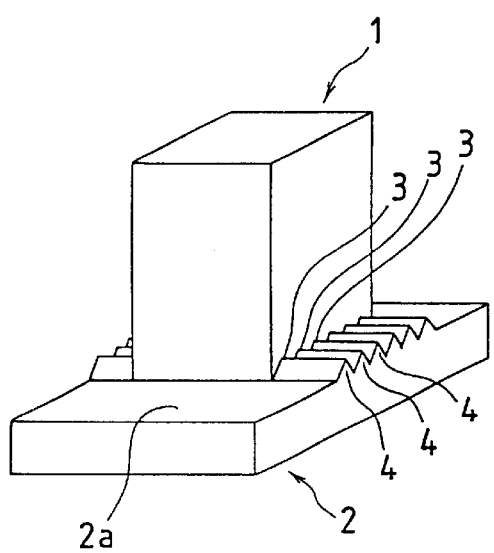
FIG. 3B is a perspective view showing the state in which the first IC chip and the second IC chip are bonded together by fitting the large number of V-shaped grooves of the first IC chip shown in FIG. 3A to the large number of V-shaped elongate projections of the second IC chip shown in FIG. 3A, according to a method of the present invention.

When it is necessary to increase the bonding strength between the IC chip 1 and the IC chip 2, a plurality of tapered grooves 3 may be provided in rows on the bonding surface 1a of the IC chip 1, while a plurality of elongate projections 4 respectively corresponding to the tapered grooves 3 are provided in rows on the bonding surface 2a of the IC chip 2, thereby increasing a substantial area of fitting between the tapered grooves 3 and the elongate projections 4, as shown in FIG. 3A FIG. 3B shows the bonded state of the IC chip 1 to the IC chip 2 shown in FIG. 3A.

As described above, since the bonding of the IC chip 1 to the IC chip 2 is largely dependent on the wedge effect utilizing the friction between the two walls 3a and 3b of the tapered groove 3 and the tapered surfaces 4a and 4b of the elongate projection 4, together with the force exerted in pinching the tapered surfaces 4a and 4b of the elongate projection 4 with the two walls 3a and 3b of the tapered groove 3, it is possible to strengthen the whole bonding force by increasing the area for substantially fitting the tapered groove 3 to the elongate projection 4. Further, the total sum of the bonding forces based on the interatomic force and the metallic bond also increases with the increase of the fitting area.

As shown in FIG. 3A, when the tapered grooves 3 are provided in rows at the same pitch throughout the bonding surface 1a of the IC chip 1, or when the tapered grooves 3, larger in number than that of the elongate projections 4, are provided in rows at the same pitch, the IC chip 1 may be bonded to the IC chip 2 with the tapered grooves 3 shifted relative to the elongate projections by some row pitches of the tapered grooves 3.

Figure 4A:
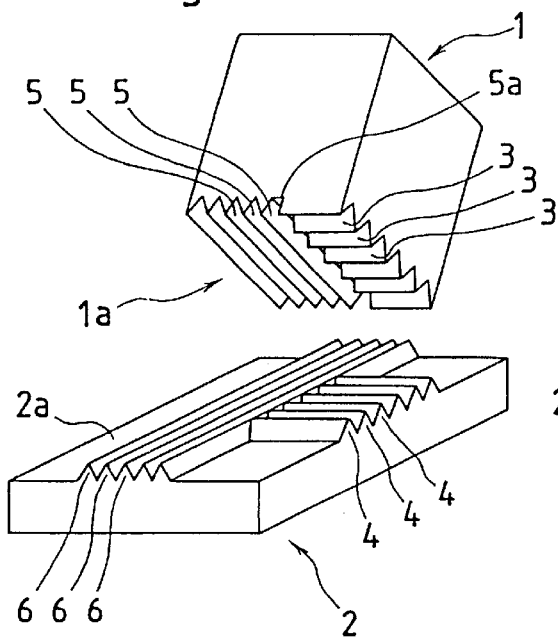
FIG. 4A is a perspective view showing a first IC chip having a large number of V-shaped grooves parallel to one another in a first direction and a large number of V-shaped grooves in a second direction different from the first direction, together with a second IC chip having a large number of V-shaped elongate projections parallel to one another in a first direction and a large number of V-shaped elongate projections in a second direction different from the first direction.

Further, when both the accurate positioning and the strengthened bonding force are required for the bonding of the IC chip 1 to the IC chip 2, the tapered grooves 3 and 5 differing in direction from each other are respectively provided in rows on the bonding surface 1a of the IC chip 1, while the elongate projections 4 and 6 respectively corresponding to the tapered grooves 3 and 5 are provided in rows on the bonding surface 2a of the other IC chip 2, as shown in FIG. 4A.

Figure 4B:
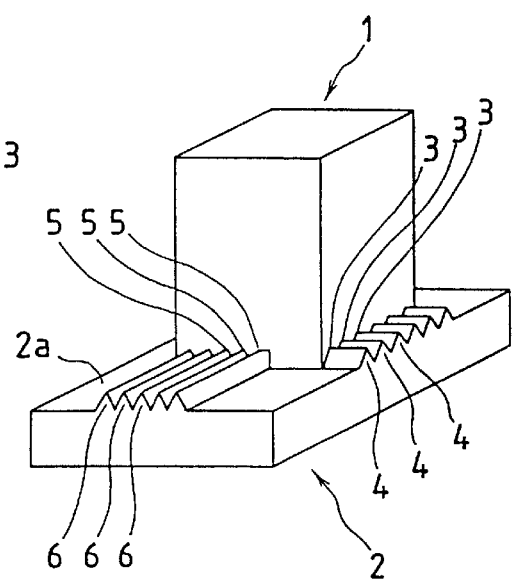
FIG. 4B is a perspective view showing the state in which the first IC chip and the second IC chip are bonded together by fitting the large number of V-shaped grooves of the first IC chip shown in FIG. 4A to the large number of V-shaped elongate projections of the second IC chip shown in FIG. 4A according to a method of the present invention.

FIG. 4B shows the bonded state of the IC chip 1 to the IC chip 2 shown in FIG. 4A.

In an embodiment shown in FIG. 4A, similarly to the embodiment shown in FIG. 3A, the IC chip 1 may be bonded to the IC chip 2 with the tapered grooves 3 shifted by some pitches relative to the elongate projections 4. Further, since the bottom 5a of the tapered groove 5 adjacent to the end of the tapered groove 3 is formed to have a certain degree of width, for example, a width equivalent to the same of the other several tapered grooves 5, unlike the width of each bottom of the other V-shaped tapered grooves 5, the IC chip 1 can also be bonded to the IC chip 2 with the tapered grooves 5 shifted relative to the elongate projections 6 by several pitches when bonding the IC chip 1 to the IC chip 2.

The number of pitches by which the tapered grooves 5 can be shifted relative to the elongate grooves 6, when bonding, is dependent on the relation between the row pitch of the tapered grooves 5 and the width of the bottom 5a of the tapered groove 5 adjacent to the end of the tapered groove 3. For instance, when the width of the bottom 5a is equivalent to three row pitches of the tapered grooves 5, the shift up to three row pitches is possible.

Even when the bottom 5a of the tapered groove 5 adjacent to the end of the tapered groove 3 has the V-shape shape similar to that of the bottom of each of other tapered grooves 5, the same effect as the above can be attained as long as an appropriate gap is formed between the elongate projection 6 adjacent the end of the elongate projection 4 and the end of the elongate projection 4.

Further, three or more IC chips can be bonded together by the application of various bonding methods shown in FIGS. 1A to 4B.

Figure 5:
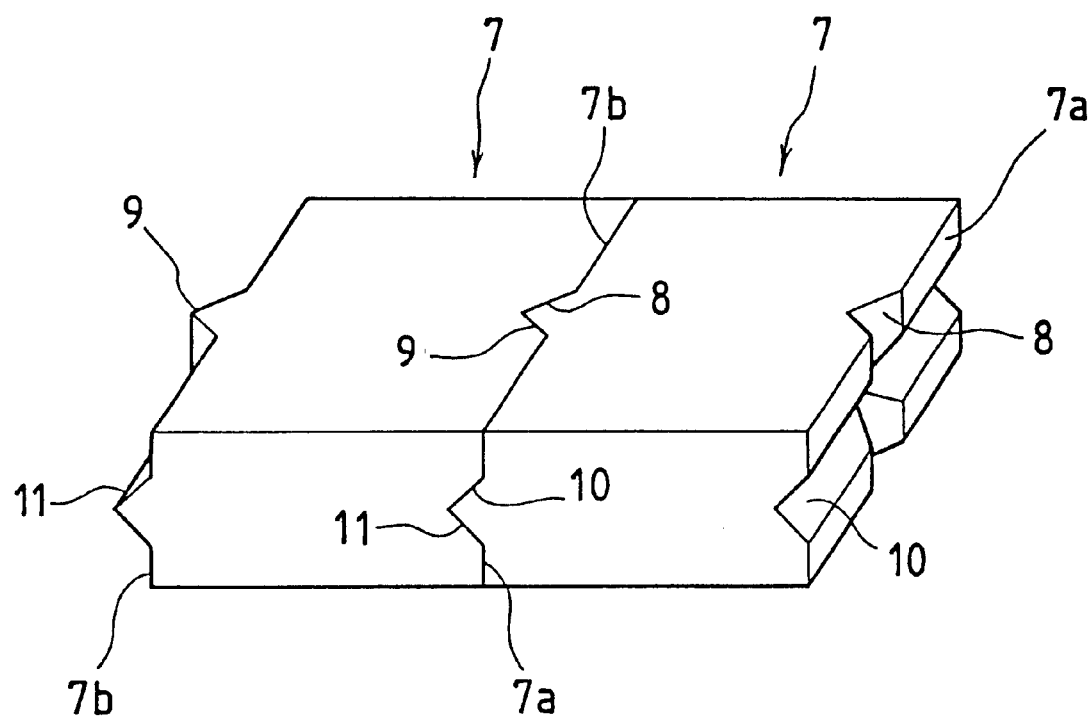
FIG. 5 is a perspective view showing a case where a plurality of IC chips can be bonded to the front and rear of one IC chip according to a method of the present invention.

For instance, FIG. 5 shows an embodiment in which three or more IC chips are bonded together in series by the application of the bonding method shown in FIGS. 2A and 2B.

In this case, since the IC chips are bonded together in series, both sides of each IC chip 7 serve as bonding surfaces 7a and 7b, and tapered grooves 8 and 10, differing in direction from each other, are formed on one bonding surface 7a, while elongate projections 9 and 11 respectively corresponding to the tapered grooves, 8 and 10 are formed on the other bonding surface 7b. As shown in FIG. 5, the IC chips 7 adjacent to each other may be bonded together, due to the wedge effect described above, the interatomic force and the metallic bond, by bringing the bonding surface 7a of one IC chip 7 into contact with the bonding surface 7b of the other IC chip 7 and fitting the elongate projections 9 and 11 on the bonding surface 7b into the tapered grooves 8 and 10 on the bonding surface 7a.

In the embodiment shown in FIG. 5, the IC chips 7 of the exactly same shape are bonded together in series. However, it is to be understood that as long as there is compatibility between the tapered groove and the elongate projection on the bonding surfaces of the adjacent IC chips to be bonded together, the bonding of these IC chips is possible, without causing any problems even if the adjacent IC chips to be bonded together are different in size and shape.

Further, in the embodiment shown in FIG. 5, the tapered grooves are formed on one bonding surface of the IC chip, while the elongate projections are formed on the other bonding surface of the same IC chip. However, it is to be understood that only the tapered grooves or the elongate projections may be formed on both of two bonding surfaces of one IC chip, while the elongate projections or the tapered grooves may be formed on the bonding surface of the other IC chip to be bonded thereto.

In the embodiment shown in FIG. 5, the bonding surfaces are provided on both of the left and right sides of the IC chip for bonding the IC chips together in series. However, it is to be understood that the bonding surface may be provided on each of two or more sides arbitrarily selected from six sides of the IC chip so that three or more IC chips can be bonded together in longitudinal or lateral rows or in layers, or furthermore, in three-dimensional arrangements.

Since an aggregate of IC chips may be formed according to a space for the storage of the IC chips, space saving and higher integration of a circuit can be made possible.

In the embodiments shown in FIGS. 1A to 5, an appropriate angle is required to be selected as a taper angle α of each set of the tapered groove 3 and the elongate projection 4, the tapered groove 5 and the elongate projection 6, the tapered groove 8 and the elongate projection 9 and the tapered groove 10 and the elongate projection 11 according to the purpose of bonding the IC chips together.

Figure 6A:
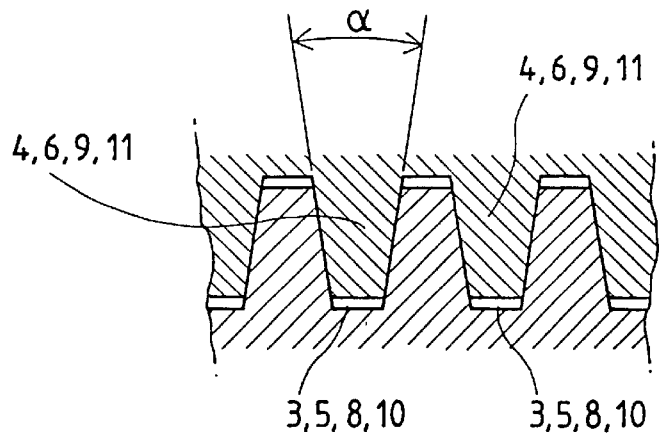
FIG. 6A is a view for explaining a case where a first IC chip and a second IC chip are placed not allowing to be detached from each other, since, when a plurality of V-shaped grooves formed on the first IC chip are engaged with a plurality of V-shaped elongate projections formed on the second IC chip, angle a of V-shaped elongate projections and also of V-shaped grooves is small.
Figure 6B:
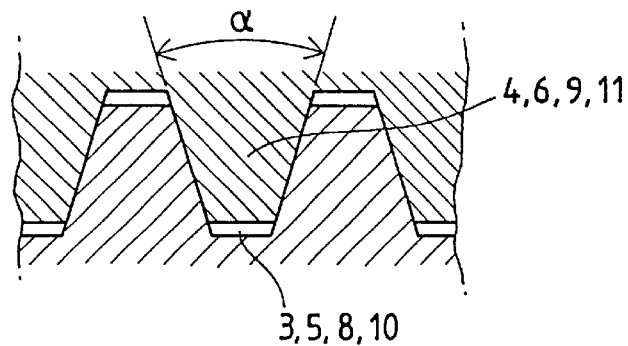
FIG. 6B is a view for explaining a case where a first IC chip and a second IC chip, engaged with each other, can be detached from each other when external force is applied, since, when a plurality of V-shaped grooves formed on the first IC chip are engaged with a plurality of V-shaped elongate projections formed on the second IC chip, angle α of V-shaped elongate projections and also of V-shaped grooves is slightly large.
Figure 6C:
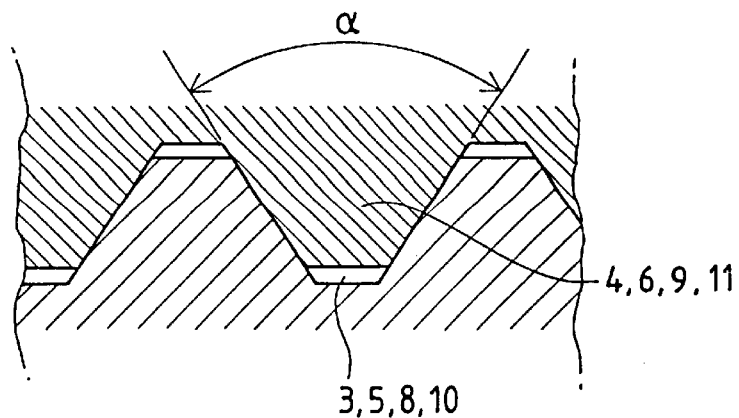
FIG. 6C is a view for explaining a case where a first IC chip can slide relative to a second IC chip, since, when a plurality of V-shaped grooves formed on the first IC chip are engaged with a plurality of V-shaped elongate projections formed on the second IC chip, angle α of V-shaped elongate projections and also of V-shaped grooves is considerably large.

If the undetachable bonding wherein one IC chip cannot be detached from the other IC chip is desired, the taper angle α should be set to about 30° (Morse taper No. 0) as shown in FIG. 6A. On the other hand, if it is desired that the IC chips bonded together can be kept bonded in the normal state but can be detached from each other without breakage when an external force is applied, then, the taper angle α should be set to about 3 to 90°, for example, about 7/24 taper, as shown in FIG. 6B. Moreover, if only the simple slidable-engagement is required, the taper angle α should be set to at least 90° as shown in FIG. 6C.

As described above, although an adherent force (bonding force) caused by the interatomic force and the metallic bond is produced by fitting the elongate projections to the tapered grooves under pressure, the wedge effect produced by fitting the tapered grooves to the elongate projections is the most influential factor of the bonding force, and therefore, the strength of the bonding force can be adjusted by properly selecting the taper angle α.

Further, in the positioning work where the elongate projections are fitted and pressed into the tapered grooves, the positioning accuracy in the pressing direction, that is, the vertical direction shown in FIGS. 6A and 6B, cannot always be assured accurately, and an uncut portion of about 10 nm in Rmax is sometimes left on the bottom of the tapered groove or the valley between the elongate projections after the formation of the tapered grooves and the elongate projections. Thus, it is necessary to form the bottom of each tapered groove and the end of each elongate projection in a trapezoidal form as shown in FIGS. 6A and 6B, instead of a complete V-shape, so as to absorb the positioning error in the pressing direction with a gap produced between the bottom of each tapered groove and the end of each elongate projection and between the crest defined by the adjacent tapered grooves and the valley defined by the adjacent elongate projections.

Further, according to various bonding methods described with reference to FIGS. 1A to 5, the electrical connection between the IC chips can be done simultaneously with the bonding work to fit the elongate projections into the tapered grooves by providing an interface of each IC chip itself on the tapered groove or the elongate projection formed on the bonding surface of the IC chip.

Figure 7:
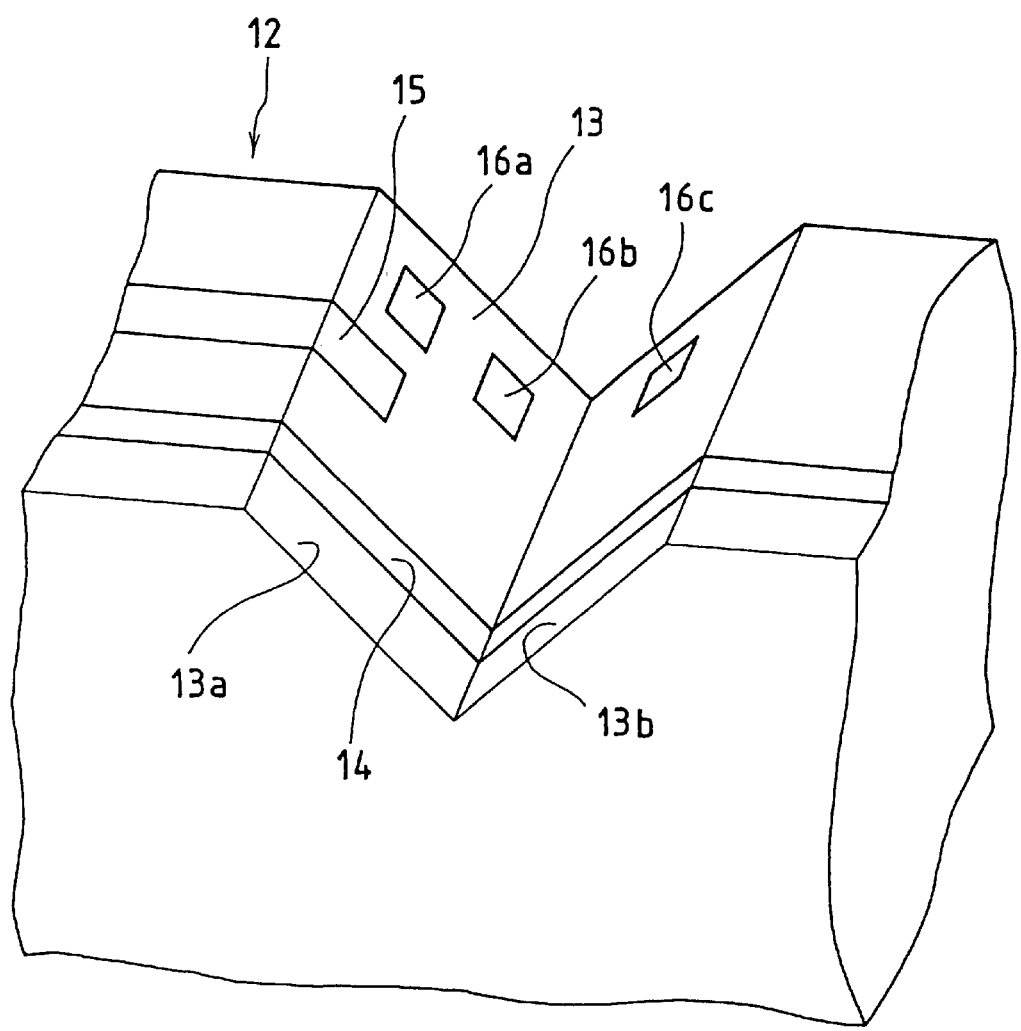
FIG. 7 is a view for explaining a case where contacts are locally formed on parts of oblique walls of a V-shaped groove of an IC chip and a belt-shaped contact is formed covering both the oblique wall and an adjoining bonding surface.

FIG. 7 shows an example of the configuration of the interface in the case where IC chips of the rectangular parallelepiped shape are bonded together by fitting a pair of tapered groove and elongate projection to each other.

In FIG. 7, only one of two IC chips to be bonded together, that is, an IC chip 12 having a tapered groove 13 is shown, and the description relating to the other IC chip to be bonded thereto, that is, an IC chip having an elongate projection is omitted.

As shown in FIG. 7, a contact serving as the interface includes a continuous belt-shaped contact like a contact 14 extending across the tapered surfaces 13a and 13b along the width direction of the tapered groove 13, a short belt-shaped contact like a contact 15 provided on a part of the tapered surface 13a or 13b along the width direction of the tapered groove 13 and spot contacts 16a, 16b and 16c each locally provided on the tapered surface 13a or 13b.

Further, contacts respectively corresponding to the contacts 14, 15, 16a, 16b and 16c are formed on the elongate projection formed on the other IC chip to be bonded to the IC chip 12 in the manner similar to that in the case of the tapered groove 13 described above, and the corresponding contacts are electrically connected to one another by bonding the elongate projection to the tapered groove 13 of the IC chip 12 (not shown).

The belt-shaped contact like the contact 14 provided along the width direction of the groove may take a relatively large area for electrical contact and therefore, is effective for stabilization of connection. Further, when spot contacts like the contacts 16a, 16b and 16c are provided in a row along the width direction of the tapered groove 13 as shown in FIG. 7, the higher integration of the circuit can be attained with ease, and also the length of the tapered groove 13 can be reduced.

The interval between the contacts may be on the order of micron or sub-micron, similar to the width or conductor spacing of the wiring produced by the semiconductor process.

Described above is an example of the configuration of the interface, in which the IC chips of rectangular parallelepiped shape are bonded together by fitting a pair of tapered groove and elongate projection to each other. However, it is to be understood that the interface utilizing the tapered groove and the elongate projection may also be applied to any of the embodiments shown in FIGS. 2 to 5, similar to the embodiment shown in FIG. 7.

In particular, if the positioning accuracy in bonding the IC chips together is high, as in the cases of the embodiments shown in FIGS. 2A, 2B, 4a and 4b and 5, then the positioning accuracy of the contacts serving as the interface of each IC chip is also high, so that the effective use of the contacts like the contacts 16a, 16b and 16c having small contact area is enabled, being advantageous in view of higher integration of the circuit.

In case of bonding the IC chips having a large number of tapered grooves and a large number of elongate projections together, as in the cases of the embodiments shown in FIGS. 3a and 3b, 4A and 4B, the number of contacts serving as the interface can be greatly increased, being advantageous in view of higher integration of the circuit.

Further, in the embodiments shown in FIGS. 3a and 3b, 4A and 4B, bonding work may be carried out with the elongate projections shifted relative to the tapered grooves by some pitches when bonding the IC chips together. Thus, as long as, a large number of contacts are provided on each of the tapered grooves and the elongate projections, it is possible to change the state of electrical connection between the IC chips for easy modification of the entire circuit configuration only by simply shifting the positions of engagement between the tapered grooves and the elongate projections from each other.

Further, since the contacts of the IC chips are directly connected together, the intermediate connecting means such as a lead frame, printed wiring and copper wiring becomes unnecessary, and, as a result, it becomes possible to attain higher speed of the overall circuit operation (i.e., shortening of the wiring). Besides, since no problems relating to increase in the volume of the contacts or the wiring for connection arise, it is possible to attain higher integration of the circuit.

In the foregoing, although a description has been given of the bonding of the IC chips as the embodiments of the bonding method of the present invention with reference to the accompanying drawings, it is to be understood that the present invention is also applicable to bonding of small parts other than the IC chips, such as semiconductor parts including LSI or the like, semiconductor devices and micromachines.

For instance, the method of the present invention may be applied to bonding of a bulk cache memory to a microprocessor. That is, a bonding surface of the microprocessor is subjected to mirror finishing, a large number of V-shaped grooves are formed on the mirror-finished bonding surface, and wall surfaces of these V-shaped grooves are also subjected to mirror finishing. On the other hand, a bonding surface of the bulk cache memory is also subjected to mirror finishing, a large number of V-shaped elongate projections are formed on the mirror-finished bonding surface, and surface of these V-shaped elongate projections are also subjected to mirror finishing. Then, the V-shaped elongate projections of the bulk cache memory are pressed into the V-shaped grooves of the microprocessor. In this case, since the surfaces of the V-shaped elongate projections and the wall surfaces of the V-shaped grooves are finished enough to provide highly-accurate surface roughness, the bulk cache memory and the microprocessor are bonded together by the action of the wedge effect and the interatomic force.

Although a few preferred embodiments of the present of the present invention have been shown and described, it would be appreciated by those skilled in the art that changes may be made en these embodiments without departing from the principles and spirit of the invention, the scope of which is defined in the claims and their equivalents.

We claim:

1. A bonding method of small parts, comprising:
   forming one or two or more V-shaped grooves on a bonding surface of a first small part;
   forming a V-shaped elongate projection, which is engageable with each V-shaped groove, on a bonding surface of a second small part; and
   bonding the first small part and the second small part together by fitting the V-shaped elongate projection of the second small part to the V-shaped groove of said first small part with no medium therebetween,
   wherein said V-shaped groove is machined by shaping or milling using a single crystalline diamond tool and a super-precision machine.

2. A bonding method of small parts, comprising:
   forming a V-shaped groove on a surface of a first small part;
   forming a V-shaped elongate projection on a bonding surface of a second small part; and
   bonding the first small part and the second small part together by fitting the V-shaped elongate projection of the second small part to the V-shaped groove of said first small part,
   wherein said V-shaped groove is machined using a single crystalline diamond tool.

3. The method according to claim 2, wherein the V-shaped groove is machined or milled a super-precision machine.

4. The method according to claim 2, further comprising:
   forming a plurality of the V-shaped grooves at a pitch of about 1 micron.

5. The method according to claim 2, wherein a surface roughness of the V-shaped groove is 10 nm in Rmax.

* * * * *